(12) United States Patent
Johnston

(10) Patent No.: US 10,950,760 B2
(45) Date of Patent: Mar. 16, 2021

(54) TWO COMPONENT GLASS BODY FOR TAPE CASTING PHOSPHOR IN GLASS LED CONVERTERS

(71) Applicant: OSRAM Opto Semiconductors GmbH, Regensburg (DE)

(72) Inventor: David W. Johnston, Kensington, NH (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/269,396

(22) Filed: Feb. 6, 2019

(65) Prior Publication Data
US 2020/0251620 A1   Aug. 6, 2020

(51) Int. Cl.
| | | |
|---|---|---|
| H01L 23/58 | (2006.01) | |
| H01L 21/00 | (2006.01) | |
| H01L 33/50 | (2010.01) | |
| C03C 4/12 | (2006.01) | |

(52) U.S. Cl.
CPC .............. *H01L 33/502* (2013.01); *C03C 4/12* (2013.01); *H01L 33/501* (2013.01); *H01L 33/504* (2013.01)

(58) Field of Classification Search
CPC .......................... H01L 33/501; H01L 33/508
USPC ........... 438/29–31, 69–72, 723; 257/98–103, 257/644
See application file for complete search history.

(56) References Cited

U.S. PATENT DOCUMENTS

| | | |
|---|---|---|
| 6,147,019 A | 11/2000 | Donohue |
| 9,420,664 B2 | 8/2016 | Allen et al. |
| 9,434,876 B2 | 9/2016 | Kida et al. |
| 9,945,530 B2 * | 4/2018 | Hager ............ F21S 43/13 |
| 2004/0145308 A1 | 7/2004 | Rossner et al. |
| 2018/0363860 A1 * | 12/2018 | Kasugai ............ F21K 9/64 |
| 2019/0241805 A1 | 8/2019 | Ando |

FOREIGN PATENT DOCUMENTS

| | | |
|---|---|---|
| EP | 2571066 A1 | 3/2013 |
| JP | 2000072533 A | 3/2000 |
| WO | 2018092644 A1 | 5/2018 |

OTHER PUBLICATIONS

Zhang, R., et al., "A new-generation color converter for high-power white LED: transparent Ce3+: YAG phosphor-in-glass," Laser & Photonics Reviews, vol. 8, Issue 1, Jan. 2014, pp. 158-164.

* cited by examiner

*Primary Examiner* — Calvin Lee
(74) *Attorney, Agent, or Firm* — Slater Matsil, LLP

(57) ABSTRACT

The present invention is directed to a method for preparing a glass device comprising the steps of: —preparing a mixture comprising: —at least two glass components, —a solvent, —at least one binder system, —optionally at least one defoamer, —blending the mixture to form a blend mixture, —grinding the blend mixture to form a grinded mixture, —casting the grinded mixture to form a layer, and —drying the layer to form a dried layer of a glass device. The present invention is further directed to a glass device, a wavelength converter and a light emitting device comprising the glass device and/or the wavelength converter.

11 Claims, 4 Drawing Sheets

TWO COMPONENT GLASS BODY FOR TAPE CASTING PHOSPHOR IN GLASS LED CONVERTERS

TECHNICAL FIELD

The invention relates to the field of solid-state lighting and more specifically to glass devices for LED technology.

BACKGROUND

Phosphor in glass converter plates have been produced using Spark Plasma Sintering, wire sawing, polishing/lapping and dicing. Phosphor in glass converter plates may also be produced using a traditional thermal sintering process followed by wire sawing, polishing/lapping and dicing. Attempts to produce items via a traditional tape cast, punch and sinter process have failed due to loss of shape and dimensions.

U.S. Publication No. 2004/0145308 discloses a light source having a luminescence conversion body. The luminescence conversion body is a polycrystalline ceramic body which is united with a solution of a dopant.

U.S. Pat. No. 9,420,664 discloses a light emitting device having a light emitting composite material including a glassy material and a plurality of phosphor particles suspended within the glassy material.

U.S. Pat. No. 6,147,019 discloses a glass composition incorporated into a castable dielectric composition for the fabrication of multilayer circuits.

Zhang et al, Laser Photonics Re. 2014, 8(1), 158-164 discloses a phosphor-in-glass color converter.

SUMMARY

It is an object of the present invention to obviate the disadvantages of the prior art.

It is another object of the present invention to provide a method for producing a glass device that might be used in LED applications.

It is another object of the present invention to provide a glass device that might be used in LED applications.

It is a further object of the present invention to provide a wavelength converter.

Furthermore, it is an object of the present invention to provide a light emitting device comprising at least one glass device and/or at least one wavelength converter.

In accordance with one object of the present invention there is provided a method for preparing a glass device comprising the steps of: —preparing a mixture comprising: —at least two glass components, —a solvent, —at least one binder system, —optionally at least one defoamer, —blending the mixture to form a blend mixture, grinding the blend mixture to form a grinded mixture, —casting the grinded mixture to form a layer, and—drying the layer to form a dried layer of a glass device.

In accordance with another object of the present invention there is provided a glass device prepared by a method according to the present invention.

In accordance with another object of the present invention there is provided a wavelength converter prepared by a method according to the present invention.

The invention is further directed to a glass device comprising: —a matrix consisting of at least one glass component, and—at least one glass particle intercalated in the matrix.

The invention is further directed to a wavelength converter comprising: —a matrix consisting of at least one glass component and at least one phosphor, and—at least one glass particle intercalated in the matrix.

In accordance with another object of the present invention there is provided a light emitting device comprising: —a light source, and—at least one glass device according to the present invention and/or at least one wavelength converter according to the present invention.

BRIEF DESCRIPTION OF THE DRAWINGS

The invention is explained in more detail below on the basis of the examples and with reference to the associated figures. The figures are diagrammatic and do not represent illustrations that are true to scale.

DETAILED DESCRIPTION OF ILLUSTRATIVE EMBODIMENTS

For a better understanding of the present invention, together with other and further objects, advantages and capabilities thereof, reference is made to the following disclosure and appended claims taken in conjunction with the above-described drawings.

References to the color of the phosphor, LED, or conversion material refer generally to its emission color unless otherwise specified. Thus, a blue LED emits a blue light, a yellow phosphor emits a yellow light and so on.

Figure 4:
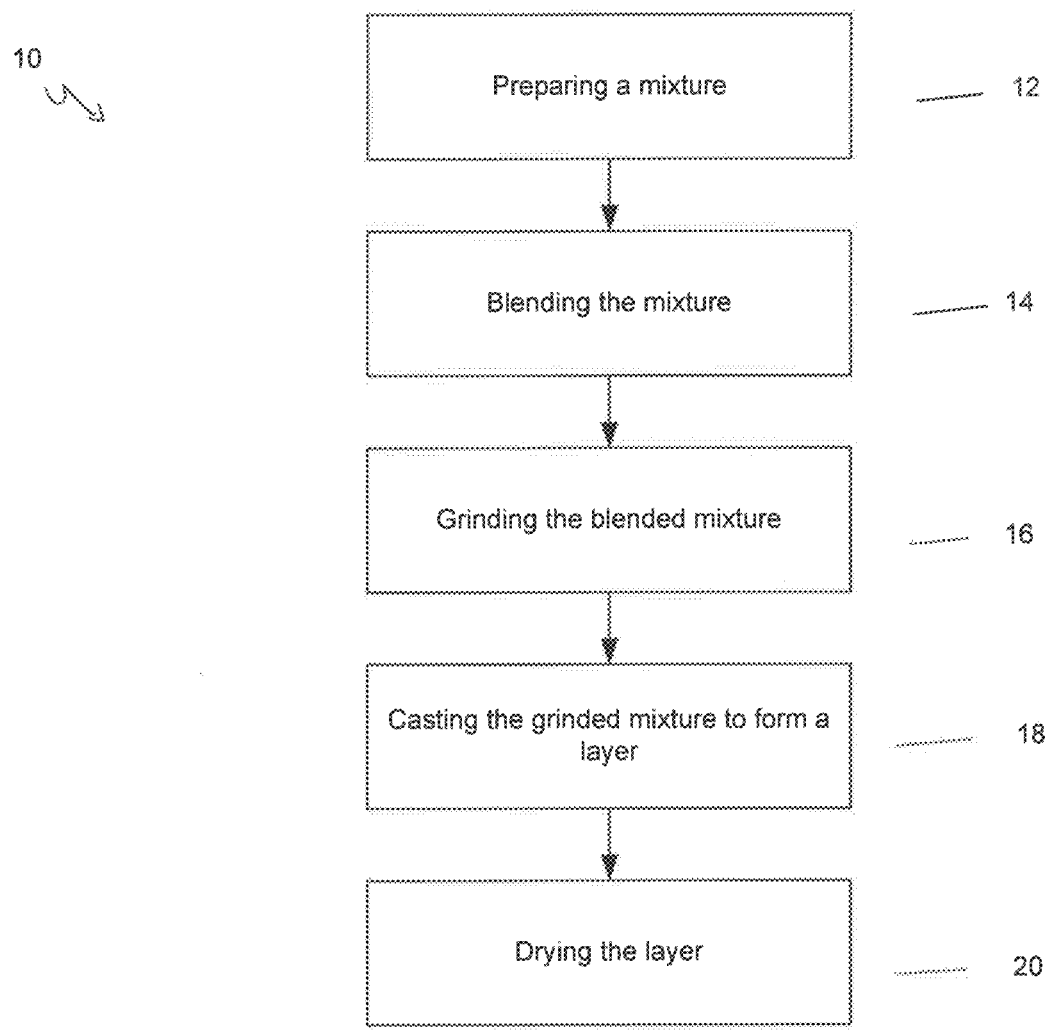
FIG. 4 shows a method for preparing a glass device according to embodiments.

Embodiments of the present invention are directed to a method for preparing a glass device 10 as shows in FIG. 4. The method comprises the steps of preparing a mixture 12 comprising at least two glass components, a solvent, at least one binder system, and optionally at least one defoamer, blending the mixture 14 to form a blend mixture, grinding the blended mixture 16 to form a grinded mixture, casting the grinded mixture 18 to form a layer, and drying the layer 20 to form a dried layer of a glass device.

In an embodiment, the glass device is used in an optoelectronic device, especially in a LED (light emitting device).

The glass components may be selected from any silicate known in the art. The glass components may be selected from a group of silicates. Preferably the at least two glass components are different, i.e., they have different physical and/or chemical properties. Physical properties are, e.g., softening points, optical properties, e.g., refractive index, transparency, scattering properties, reflection properties and thermal expansion. Chemical properties are, e.g., the chemical composition and the chemical durability, such as the resistance to acids, bases and the attack from humidity.

In an embodiment, the at least two glass components have different softening points. In a preferred embodiment, one of the glass components has a high softening point and the other glass component has a low softening point.

In a further embodiment, at least one of the two glass components has a softening point of between about 900° C. and about 1000° C. and/or at least one of the glass components has a softening point of between about 700° C. and about 800° C. In a further embodiment one of the glass components has a softening point of between about 1500° C. and about 1600° C., and/or at least one of the glass components has a softening point of between about 500° C. and about 800° C. In a further embodiment, one of the glass components has a softening point of between about 500° C. and about 800° C., and/or at least one of the glass components has a softening point of between about 275° C. and about 400° C. The glass components may be chosen in this way that in the method for preparing a glass device, at least one of the glass components softens or deforms and at least one of the other glass components does not soften or deform. The glass component which neither softens, nor deforms may act as a filler material in the mixture. The glass component which has a lower softening point may function as an inorganic binder in the mixture. The glass which has a higher softening point may act as a transparent filler and does not soften or deform to any appreciable amount during the processing, e.g., during a sintering step. The glass component having the higher softening point may form a matrix. The glass component having the lower softening point may intercalate into the matrix. The composition of the glass components can be chosen with an index of refraction that will increase the amount of scattering in the processed glass device, e.g., in the sintered glass device, as required by the desired properties of the finished glass device and any device which comprises the glass device, e.g., a LED comprising the glass device.

The glass components may be chosen to influence the properties of the glass device. For example, one of the glass components may be chosen with an index of refraction that increases the amount of scattering in the glass device.

The at least two glass components may be selected from the group consisting of aluminosilicates, borosilicates, soda lime silicates, crown glasses, flint glasses, high silica glasses and low softening point solder glasses.

The mixture for preparing a glass device may comprise two glass components. The mixture for preparing a glass device may comprise three glass components. The mixture for preparing a glass device may comprise four glass components, or more.

The at least two glass components may be added in an amount of about 35 vol-% to about 90 vol-%, preferably in an amount of about 40 vol-% to about 75 vol-% with respect to the total volume of inorganic solids of the mixture.

The glass component(s) having the lower softening point may be added in an amount of about 35 vol-% to about 50 vol-% with respect to the total volume of the inorganic solids of the mixture.

The glass component(s) having the higher softening point may be added in an amount to add up to about 65 vol-% respect to the total volume of the inorganic solids of the mixture.

The mixture for preparing a glass device further comprises a solvent. The solvent may be a pure solvent, or a mixture of solvents.

In an embodiment, the solvent may be a protic or an aprotic solvent. The solvent may be an organic solvent, e.g., a mixture of methylethyl ketone and ethyl alcohol or a mixture of trichloroethylene and ethyl alcohol. In an embodiment, the solvent is water.

The solvent(s) may be added in an amount of about 20 vol-% to about 80 vol-%, preferably in an amount of about 40 vol-% to about 70 vol-% with respect to the total volume of the mixture.

The mixture for preparing a glass device further comprises at least one binder system. A binder system according to the embodiments of the present invention is a system that enables or facilitates the binding of the components of the mixture for preparing a glass device. The binder system may be responsible for an adhesive binding of the components. In an embodiment, the binder system comprises a binding agent and a plasticizer. Preferably, the binding agent and the plasticizer are compatible with each other.

The binding agent may be an organic compound, e.g., an acrylate, acrylic compound, cellulose, polyvinyl alcohol, polyethylene polyvinyl butyral. The binding agent may be an acrylic compound.

The binding agent may be added in an amount of about 3 vol-% to about 25 vol-%, preferably in an amount of about 5 vol-% to about 20 vol-%, with respect to the total volume of the mixture.

A plasticizer is a material that increases the plasticity and decreases the viscosity of a mixture. The plasticizer may be an organic compound, e.g., an ester, glycol, a phthalate, or an amine. The plasticizer may be triethanolamine.

The plasticizer may be added in an amount of more than 0 vol-% to about 20 vol-%, preferably in an amount of more than 0 vol-% to about 4 vol-% with respect to the total volume of the mixture.

In an embodiment, the binder system is an acrylic binder system.

The mixture for preparing a glass device may further comprises at least one defoamer. A defoamer eliminates or reduces the foaming of the mixture, which in general facilitates the processing of the mixture. The reduction or elimination of the foaming might also reduce the number of inclusions, e.g., gas or air inclusions, in the mixture and the product made out of the mixture. The defoamer is especially present if the binder system is an acrylic binder system.

The defoamer may be selected from the group consisting of glycol and carboxylate.

The defoamer may be added in an amount of more than 0 vol-% to about 0.5 vol %, preferably in an amount of more than 0 vol-% to about 0.2 vol-% with respect to the total volume of the mixture.

The mixture may further comprise at least one phosphor. A phosphor is a material that converts light of a certain first wavelength to light of a certain second wavelength. The phosphor may be a polycrystalline, monocrystalline, or amorphous material. The phosphor may be an inorganic material.

First wavelengths according to embodiments of the present invention are wavelengths between 300 nm to 570 nm. In an embodiment the first wavelengths are between 350 nm to 500 nm. In a further embodiment the first wavelengths are between 420 nm to 480 nm.

Means for producing light of a first wavelength are, e.g., InGaN or GaN chips, or solid state laser diodes.

Second wavelengths according to embodiments of the present invention are wavelengths between 350 nm to 800 nm. In an embodiment the second wavelengths are between 380 nm to 750 nm. In a further embodiment the second wavelengths are between 400 nm to 700 nm. In another embodiment, light of the second wavelength is white light.

In an embodiment, the phosphor is selected from the group consisting of an yttrium aluminum oxide garnet structure with rare earth activation. Examples of an yttrium aluminum oxide garnet structure with rare earth activation are $Y_3Al_5O_{12}$:Ce, $(GdY)_3Al_5O_{12}$:Ce, $Y_3(AlMg)_5O_{12}$:Ce, $Y_3(Al_5O_5O_{12}$:Ce, and $Lu_3Al_5O_{12}$:Ce. The mixture may comprise one phosphor, or may comprise a mixture of phosphors, e.g., a mixture of two, three or more phosphors. The phosphor(s) may be chosen to match the index of refraction of the glass components. The phosphor(s) may also be chosen to mismatch the index of refraction of the glass component(s). The phosphor(s) may preferably be chosen to improve the optical properties of the glass device.

The phosphor may be added in an amount of more than 0 vol-% to about 45 vol-%, preferably in an amount of about 2 vol-% to about 20 vol % with respect to the total volume of the inorganic solids of the mixture in the form of a slurry, i.e., the mixture of the solvent, the binder, the plasticizer, the optional defoamer, the glass components and the phosphor. Glass devices comprising a phosphor may also be called wavelength converters.

The amount of the glass component(s) and optionally of the phosphor may be in a ratio that results in the desired transmission and absorption/emission properties of the resulting device at the desired final size of the glass device.

In an embodiment to maintain shape, the inert materials (i.e., the phosphor and the higher softening point glass components) in combination might constitute from about 50 vol-% to about 65 vol-% with respect to the total volume of the inorganic solids of the mixture. Within the inert portion of the materials the amount of phosphor can be 0 vol-%, which would result in a clear glass plate with respect to the total volume of the inorganic solids of the mixture. The phosphor component may be from about 20 vol-% to about 70 vol-% of the inert (with respect to sintering only) components with respect to the total volume of the inorganic solids of the mixture. Therefore for the lower softening point glass may be present in an amount of about 35 vol-% to about 50 vol-% with respect to the total volume of the inorganic solids of the mixture and the phosphor may be present in the amount of from about 10 vol-% of the total to about 65 vol-% of the total with the higher softening point glass making up the remainder (of the sintered converter plate).

According to embodiments of the present invention, the method for preparing a glass device comprises the step of preparing a mixture, which may be accomplished by adding the components of the mixture to a suitable device. The suitable device may be chosen in this way to facilitate the further method steps.

The method further comprises the step of blending the mixture to form a blend mixture. The blending might be performed with a mixer, or any other suitable device. The blending step might be performed between about 0.1 hours to about 0.5 hours, preferably between about 0.1 hours to about 0.2 hours. In an embodiment, the blending step is in combination with the mixing step.

The method further comprises the step of grinding the blend mixture to form a grinded mixture. The grinding may be performed in a roller mill. The grinding may be also carried out in an attritor mill, a bead mill, or a high shear mixer. The grinding step in general shreds the mixture to particles with a size of between about 0.1 μm to about 50 μm. The grinding step might be performed between about 1 hour to about 120 hours, preferably between about 1 hour to about 72 hours.

The method further comprises the step of casting the grinded mixture to form a layer. The casting step might be carried out on a temporary or permanent substrate. A permanent substrate is a substrate that remains with the glass device and is permanently connected to the glass device. A temporary substrate is a substrate that is disconnected from the glass device at some point of the method for preparing a glass device. Suitable permanent substrates might be sapphire or glass. Suitable temporary substrates might be Mylar (a PET film). In an alternative embodiment, the casting step might be performed on a surface and the resulting layer does not in any way bind to the surface. The layer may have a size of between about 5 μm to about 250 μm. In an embodiment the layer has a size of between about 15 μm to about 150 μm.

The step of casting the grinded mixture to form a layer may also comprise the casting of several layers, e.g., two, three, four or more layers, on top of each other.

The method for preparing a glass device further comprises the step of drying the layer to form a dried layer of a glass device. The drying step might comprise the drying in air. The drying step might also comprise a sintering step. The sintering might be performed at a normal pressure. The sintering temperature is normally below the working point of the glass with a higher softening point, and below the melting point of the phosphor. In a preferred embodiment, the sintering temperature is chosen in this way, that at least one of the glass components softens and at least one of the glass components does not soften. Typical sinter temperatures are between about 200° C. to about 1200° C., preferably between about 250° C. to about 900° C. In an alternative embodiment, the drying step might be performed at an elevated temperature, at which none of the components of the mixture softens or melts. In an aspect of this embodiment, the elevated temperature is chosen that the solvent evaporates. Typical elevated temperatures are between about 25° C. to about 100° C., preferably between about 30° C. to about 80° C. for aqueous systems. The drying temperatures for organic solvent systems are selected as a function of the vapor pressure and flammability of the solvent.

In an embodiment, the thermal processing removes the tape casting binder and the defoamer (if present) and the lower softening point glass becomes the glue which binds the phosphor and higher softening point glass together during the sintering (or fusing).

In an embodiment, the method for preparing a glass device further comprises the step of assembling at least two dried layers together. The assembling step may be carried out by laminating in a press. In an aspect of this embodiment, at least three dried layers may be assembled together. In an aspect of this embodiment, at least four dried layers may be assembled together. In an aspect of this embodiment, at least five dried layers may be assembled together. In an aspect of this embodiment, more than five dried layers may be assembled together.

In an embodiment, the method for preparing a glass device further comprises the step of punching the dried layer into at least one plate. The punching may be carried out by a pneumatic or motor driven press with the appropriate size die and punch. In an aspect of this embodiment, the dried layer is punched to near net shape. The punching may lead to a plate having a size of between about 0.2 mm to about 20 mm in length, preferably of between about 0.4 mm to about 5 mm in length.

In a further embodiment, the method for preparing a glass device further comprises the step of sintering the at least one plate. The sintering might be performed at a normal pressure or at increased pressure. The sintering temperature is normally below the softening point of the higher temperature glass and below the melting point of the phosphor. In a preferred embodiment, the sintering temperature is chosen in this way, that at least one of the glass components softens and at least one of the glass components does not soften. Typical sinter temperatures are between about 200° C. to about 1200° C., preferably between about 250° C. to about 900° C. In an alternative embodiment, the drying step might be performed at an elevated temperature, at which none of the components of the mixture softens or melts. In an aspect of this embodiment, the elevated temperature is chosen that the solvent evaporates. Typical elevated temperatures are between about 25° C. to about 100° C., preferably between about 30° C. to about 80° C. for aqueous systems. The drying temperatures for organic solvent systems are selected as a function of the vapor pressure and flammability of the solvent.

In an alternative embodiment, the sintering step may be performed with the dried layer, or the assembled dried layers, prior to any optional punching step. The sintering step may correspond to the sintering as described above.

The method for preparing a glass device allows a typical tape cast, punch and sinter process to be employed producing semi-transparent, near net shape glass devices, e.g., LED phosphor converter plates, without expensive and slow wire sawing, grinding/lapping, and dicing operations.

The method for preparing a glass device according to embodiments of the present invention might comprise the step of removing the organic components and fusing the glass components to make a solid device.

The present invention is further directed to a glass device prepared by a method as described herein.

The present invention is also directed to a wavelength converter prepared by a method as described herein. As mentioned herein, a glass device comprising a phosphor may be called wavelength converter. Therefore, a method for preparing a glass device as described herein, wherein the mixture comprises at least one phosphor, might lead to a wavelength converter.

As used herein a wavelength converter is a solid mean that converts at least part of the light of a certain first wavelength to light of a certain second wavelength. The conversion is carried out by a phosphor.

The present invention is also directed to a glass device comprising: a matrix consisting of at least one glass component, and at least one glass particle intercalated in the matrix.

A matrix according to embodiments of the present invention is a configuration of a material that allows embedding a further material. The matrix may also be described as a host material for a further material, which is embedded in that host.

The matrix of the glass device according to embodiments of the present invention consists of at least one glass component, especially of the glass having the higher softening point as described herein. The glass component is preferably chosen to provide a stable matrix for the further components of the glass device. The glass component(s) are preferably chosen to provide a transparent glass device and scattering of light passing through the glass device is preferably omitted. In an embodiment, the matrix of the glass device consists of the glass having the higher softening point, combined with the phosphor (if present) to reach a level of between about 40 and about 60 vol-% of the sintered object.

The glass device further comprises at least one glass particle intercalated in the matrix. The glass particle(s) are preferably chosen to provide a transparent glass device and scattering of light passing through the glass device is preferably omitted.

In an embodiment, the glass component(s) of the matrix and glass particle(s) that intercalate into the matrix have different physical and/or chemical properties. In an aspect of this embodiment, the glass component(s) of the matrix and glass particle(s) that intercalate into the matrix have a different softening point. Preferably, the glass component(s) of the matrix have a higher softening point than the glass particle(s) that intercalate into the matrix. The glass component(s) of the matrix may have a softening point of between about 900° C. to about 1000° C., of between about 1500° C. to about 1600° C., of between about 500° C. to about 800° C. The glass particle(s) that intercalate into the matrix may have a softening point of between about 700° C. to about 800° C., of between about 500° C. to about 800° C., of between about 275° C. to about 400° C.

In an embodiment, the glass component(s) of the matrix may be selected from the group consisting of aluminosilicates, borosilicates, soda lime silicates, crown glasses, flint glasses, high silica glasses and low melting point solder glasses.

In a further embodiment, the glass particle(s) that intercalates into the matrix may be selected from the groups consisting of aluminosilicates, borosilicates, soda lime silicates, crown glasses, flint glasses, high silica glasses and low melting point solder glasses.

The glass particle(s) may have a size of about 0.1 µm to about 50 µm, preferably of about 0.1 µm to about 20 µM.

The matrix of the glass device may consist of one glass component. In an alternative embodiment, the matrix of the glass device consists of two glass components. In an alternative embodiment, the matrix of the glass device consists of three glass components. In a further embodiment, the matrix of the glass device consists of more than three glass components.

There may be one type of glass particle intercalated into the matrix of the glass device. In an alternative embodiment, two types of glass particles intercalate into the matrix of the glass device. In an alternative embodiment, three types of glass particles intercalate into the matrix of the glass device. In a further embodiment, more than three types of glass particles intercalate into the matrix of the glass device.

In a further embodiment, there are other components than the glass particle(s) intercalated into the matrix. The other components may be selected from light emitting materials such as phosphors, highly scattering materials, such as zinc oxide, titanium dioxide, etc. Transparent crystalline materials may replace the higher softening point glass, for example, sapphire.

The present invention is also directed to a wavelength converter comprising: a matrix consisting of at least one glass component and at least one phosphor, and at least one glass particle intercalated in the matrix.

The glass component(s), the phosphor(s) as well as the glass particle(s) may be chosen as for the glass device described herein.

The matrix of the wavelength converter according to embodiments of the present invention consists of at least one glass component, especially of the glass having the higher softening point, and at least one phosphor. The glass component is preferably chosen to provide a stable matrix for the further components of the glass device. The glass component(s) are preferably chosen to provide a transparent glass device and scattering of light passing through the glass device is preferably omitted. In an embodiment, the matrix of the glass device consists of the glass having the higher softening point and the phosphor combined to reach a level of between about 40 and about 60 vol-% of the sintered object.

In an embodiment of the present invention, the glass component(s) of the matrix and the glass particle(s) have different softening points. The softening points are preferably chosen in that way that during the processing, e.g., during a sintering step, the glass component(s) do not soften, wherein the glass particle(s) soften.

In a further embodiment, the glass component(s) of the matrix have a softening point of between about 900° C. and about 1000° C. and/or the glass particle(s) have a softening point of between about 700° C. and about 800° C. In a further embodiment, the glass component(s) of the matrix have a softening point of between about 1500° C. and about 1600° C., and/or the glass particle(s) have a softening point of between about 500° C. and about 800° C. In a further embodiment, the glass component(s) of the matrix have a softening point of between about 500° C. and about 800° C., and/or the glass particle(s) have a softening point of between about 275° C. and about 400° C.

The wavelength converter further comprises at least one phosphor. The phosphor may be a polycrystalline, monocrystalline, or amorphous material. The phosphor may be an inorganic material.

In an embodiment, at least one of the phosphors is selected from the group consisting of a rare earth activated yttrium aluminum oxide garnet structure, as e.g., described herein. The mixture may comprise one phosphor, or may comprise a mixture of phosphors, e.g., a mixture of two, three or more phosphors.

The wavelength converter according to embodiments of the present invention preferably converts light of a specific first wavelength to a specific second wavelength. The wavelength converter may convert the light of the specific wavelength completely to the specific second wavelength. Alternatively, the wavelength converter may convert the light of the specific wavelength partially to the specific second wavelength. Especially, in the latter case, the emitted light corresponds to white light.

Embodiments of the present invention are further directed to a light emitting device comprising: a light source, and at least one glass device according to embodiments of the present invention and/or at least one wavelength converter according to embodiments of the present invention.

The light source may be any emitter of light of a certain wavelength. Examples of light sources are light emitting diodes (LED), lasers, etc.

The glass devices may be used in general lighting applications, automotive lighting applications, medical lighting applications, etc.

The wavelength converters may be used in general lighting applications, automotive lighting applications, medical lighting applications, etc.

The light emitting devices may be used in general lighting applications, automotive lighting applications, medical lighting applications, etc.

With the methods according to embodiments of the present invention (tape casting, punching and sintering) wavelength converters may be produced which reduce the cost to manufacture compared to traditional methods.

Examples

Figure 1:
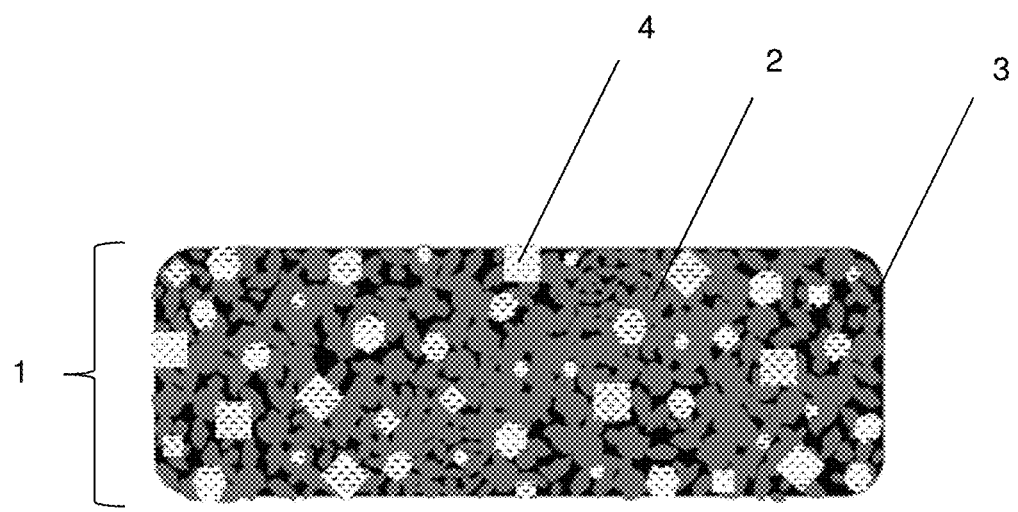
FIG. 1 shows a schematic drawing of a wavelength converter 1 according to embodiments. The wavelength converter comprises a glass component 2 and glass particles 3. The wavelength converter 1 further comprises phosphor particles 4.
Figure 2:
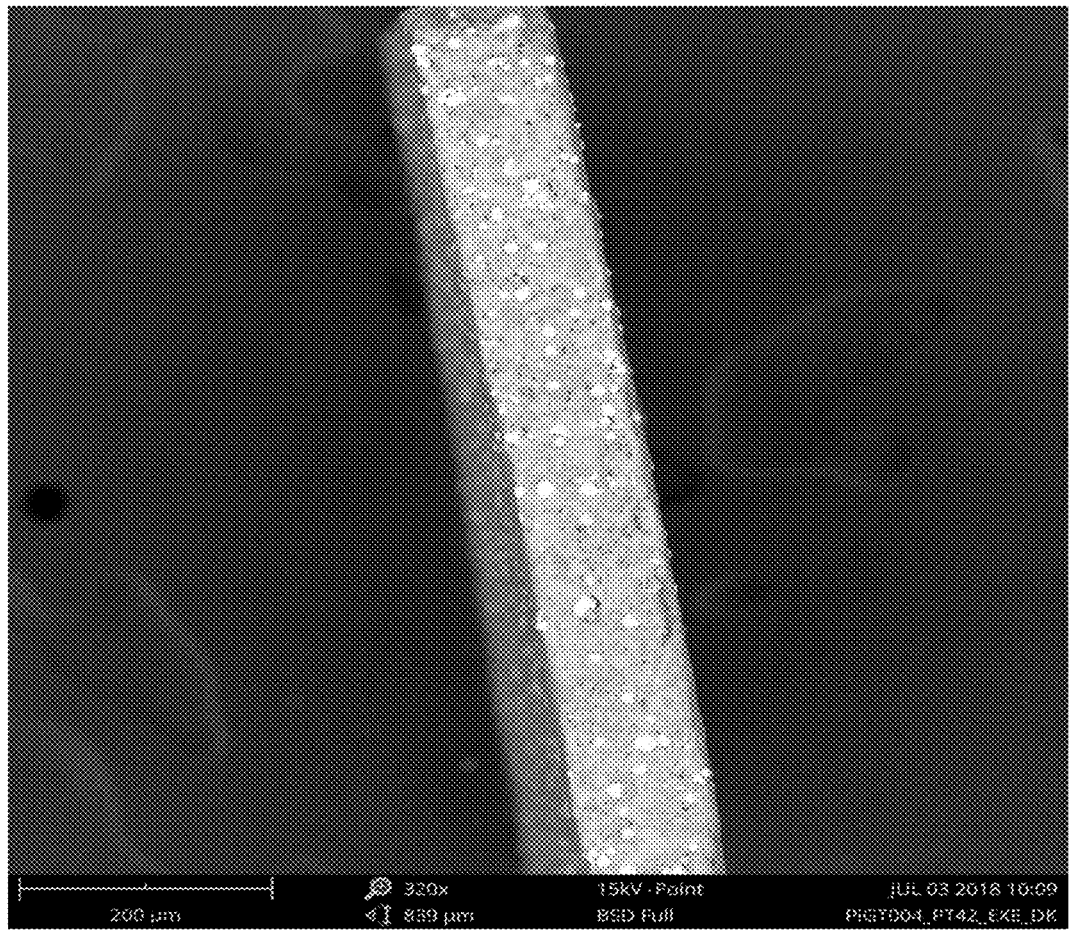
FIG. 2 is a SEM image of a cross-section of a sintered wavelength converter according to embodiments.
Figure 3:
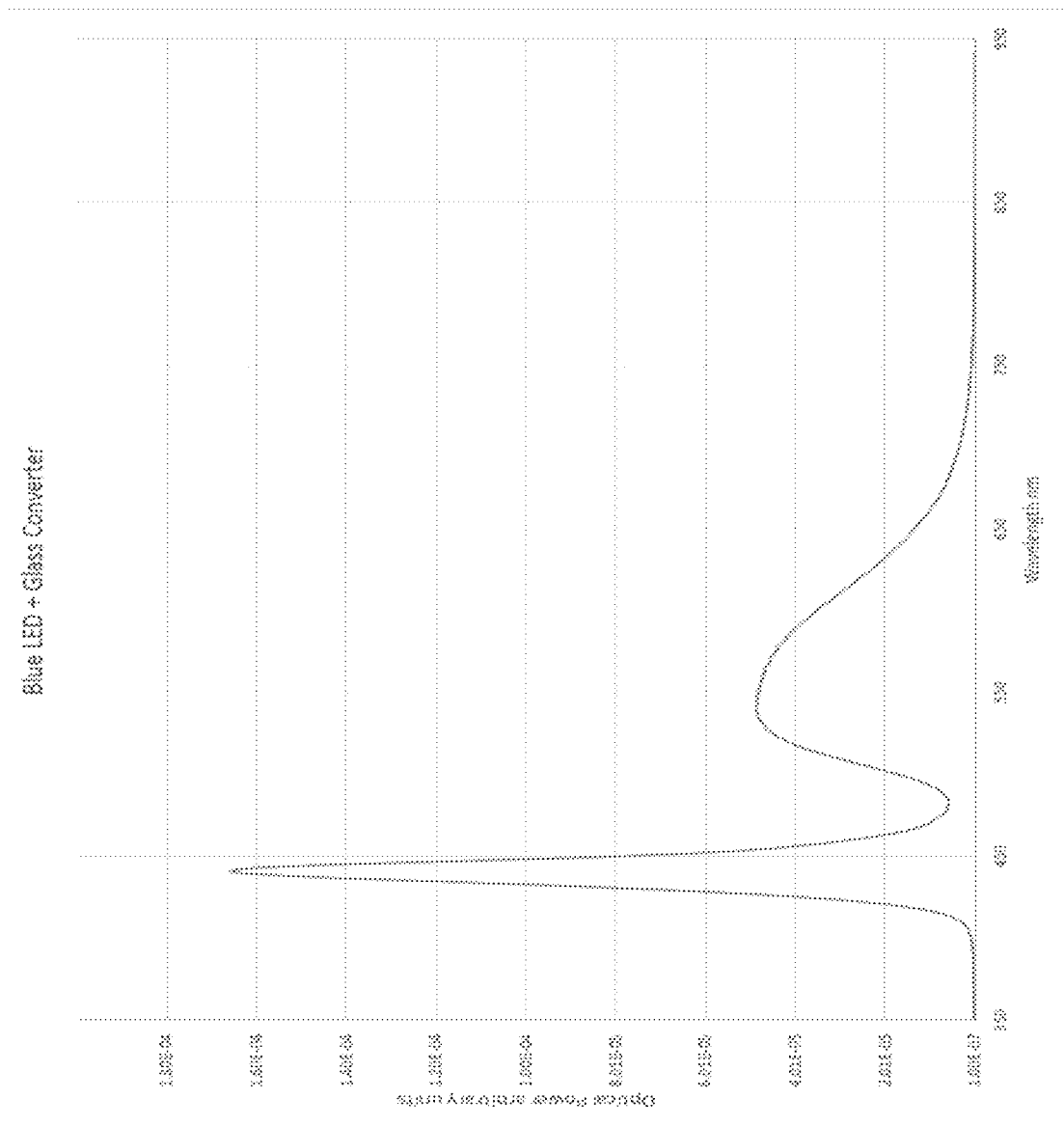
FIG. 3 shows a spectral output of an exemplary wavelength converter according to embodiments.

A 1 liter HDPE bottle was loaded with: 1100 g of milling media; 168.58 g water; 40.71 g water soluble acrylic binder (35% solids); 1.40 g plasticizer; 0.37 g defoamer; 45.80 g GdYAG:Ce phosphor; 59.59 g glass with a softening point of 825° C. and 89.51 g glass with a softening point of 935° C. These materials were roller milled for a total of 84 hours. The resulting slurry was cast on a commercial tape caster with a blade height of 300 µm. This resulted in dried tape of 45 µm thickness. Three layers of the 45 micron thickness tape were laminated and punched to form a square 1.232 µm on a side. Punched squares of the two component glass and phosphor tape were air fired at 820° C. for 17 hours. The sintered plates were 1.046 mm on a side and 115 µm thick; sintered to a theoretical density of about 92%. The sides of the sintered platelet are straight and square with no indication of distortion or rounding of the edges from the sintering operation. The typical spectral output of the converter is color coordinates Cx=0.270, Cy=0.245 and the emittance=119 lumens per optical watt blue light. FIG. 3 shows the spectral output in graphical form.

While there have been shown and described what are at present considered to be preferred embodiments of the invention, it will be apparent to those skilled in the art that various changes and modifications can be made herein without departing from the scope of the invention as defined by the appended claims. The disclosure rather comprises any new feature as well as any combination of features, which in particular includes any combination of features in the appended claims, even if the feature or combination is not per se explicitly indicated in the claims or the examples.

What is claimed is:

1. A glass device comprising:
   a matrix consisting essentially of at least one glass component and at least one glass particle intercalated in the matrix,
   wherein the glass component and the glass particle are independently selected from the group consisting of aluminosilicates, borosilicates, soda lime silicates, crown glasses, flint glasses, high silica glasses and low melting point solder glasses, and
   wherein the glass component of the matrix has a higher softening point than the glass particle intercalated in the matrix.

2. The glass device according to claim 1, wherein the at least one glass particle has a softening point of between about 700° C. and about 800° C. inclusive.

3. A light emitting device comprising:
   a light source; and
   at least one glass device according to claim 1.

4. The glass device according to claim 1, wherein the at least one glass component of the matrix has a softening point of between about 900° C. to about 1000° C. inclusive.

5. The glass device according to claim 4, wherein the at least one glass particle has a softening point of between about 700° C. and about 800° C. inclusive.

6. A wavelength converter comprising:
   a matrix consisting essentially of at least one glass component, at least one phosphor and at least one glass particle intercalated in the matrix,
   wherein the glass component and the glass particle are independently selected from the group consisting of aluminosilicates, borosilicates, soda lime silicates, crown glasses, flint glasses, high silica glasses and low melting point solder glasses, and
   wherein the glass component of the matrix has a higher softening point than the glass particle intercalated in the matrix.

7. The wavelength converter according to claim 6, wherein the at least one phosphor comprises a rare earth activated yttrium aluminum oxide garnet structure.

8. The wavelength converter according to claim 6, wherein the at least one glass particle has a softening point of between about 700° C. and about 800° C. inclusive.

9. A light emitting device comprising:
   a light source; and
   at least one wavelength converter according to claim 6.

10. The wavelength converter according to claim 6, wherein the at least one glass component of the matrix has a softening point of between about 900° C. and about 1000° C. inclusive.

11. The wavelength converter according to claim 10, wherein the at least one glass particle has a softening point of between about 700° C. and about 800° C. inclusive.

* * * * *